(12) United States Patent
Asayama

(10) Patent No.: US 7,889,540 B2
(45) Date of Patent: Feb. 15, 2011

(54) SEMICONDUCTOR DEVICE INCLUDING MEMORY HAVING NODES CONNECTED WITH CONTINUOUS DIFFUSION LAYER BUT ISOLATED FROM EACH OTHER BY TRANSISTOR

(75) Inventor: Shinobu Asayama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 137 days.

(21) Appl. No.: 12/230,842

(22) Filed: Sep. 5, 2008

(65) Prior Publication Data

US 2009/0067220 A1 Mar. 12, 2009

(30) Foreign Application Priority Data

Sep. 7, 2007 (JP) ............................. 2007-232676

(51) Int. Cl.
*G11C 11/00* (2006.01)
(52) U.S. Cl. ........................... 365/154; 365/63; 365/156
(58) Field of Classification Search ................... 365/63, 365/154, 156
See application file for complete search history.

(56) References Cited

U.S. PATENT DOCUMENTS

| | | | | |
|---|---|---|---|---|
| 5,486,785 A | * | 1/1996 | Blankenship | ............... 327/306 |
| 6,606,276 B2 | | 8/2003 | Yamauchi et al. | |
| 6,627,960 B2 | * | 9/2003 | Nii et al. | ..................... 257/371 |
| 2002/0100920 A1 | | 8/2002 | Yamauchi et al. | |
| 2004/0173841 A1 | * | 9/2004 | Violette | ..................... 257/315 |
| 2006/0220942 A1 | * | 10/2006 | Choi et al. | ................. 341/172 |
| 2008/0303545 A1 | * | 12/2008 | Chow | ........................... 326/26 |

FOREIGN PATENT DOCUMENTS

JP 2002-222874 8/2002

* cited by examiner

*Primary Examiner*—Hoai V Ho
(74) *Attorney, Agent, or Firm*—McGinn IP Law Group, PLLC

(57) ABSTRACT

A semiconductor device has a first inverter including a drive transistor and a load transistor; a second inverter including a drive transistor and a load transistor, a transmission transistor provided between the output terminal of the first inverter and one line of a bit line pair, a transmission transistor provided between the output terminal of the second inverter and the other line of the bit line pair; and an isolation transistor for isolating the drive transistor and the transmission transistor. The transmission transistor, the transmission transistor, the drive transistor, and the isolation transistor are formed in a continuous active region and the isolation transistor is provided between the drive transistor and the transmission transistor.

3 Claims, 10 Drawing Sheets

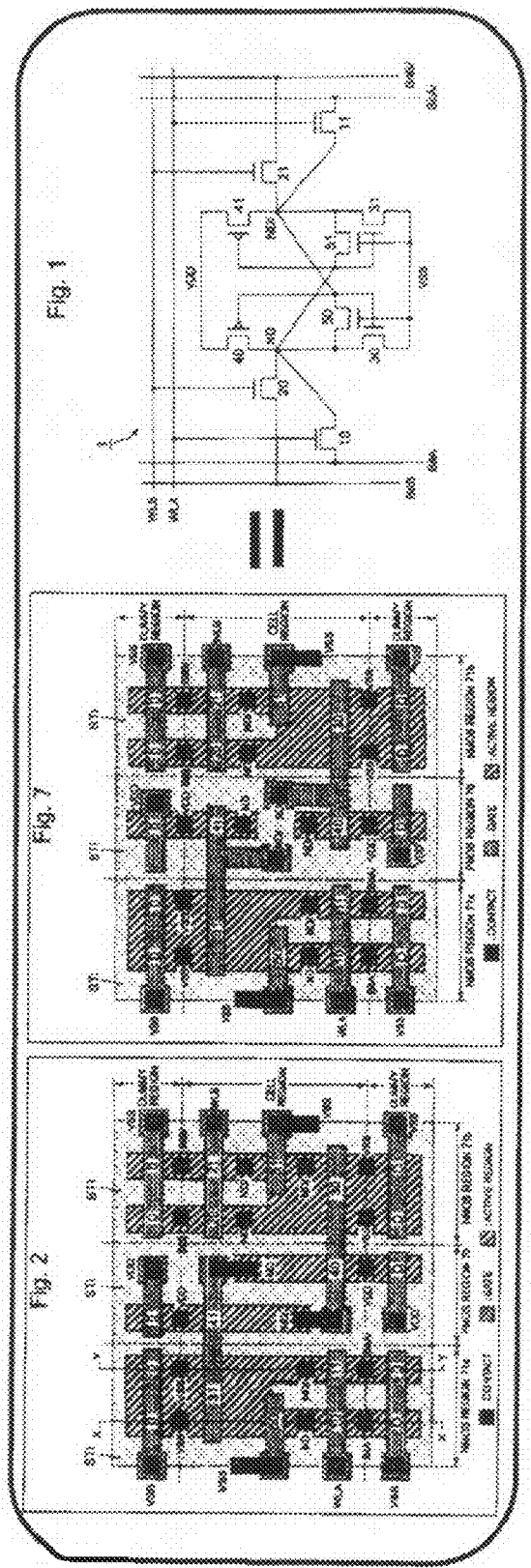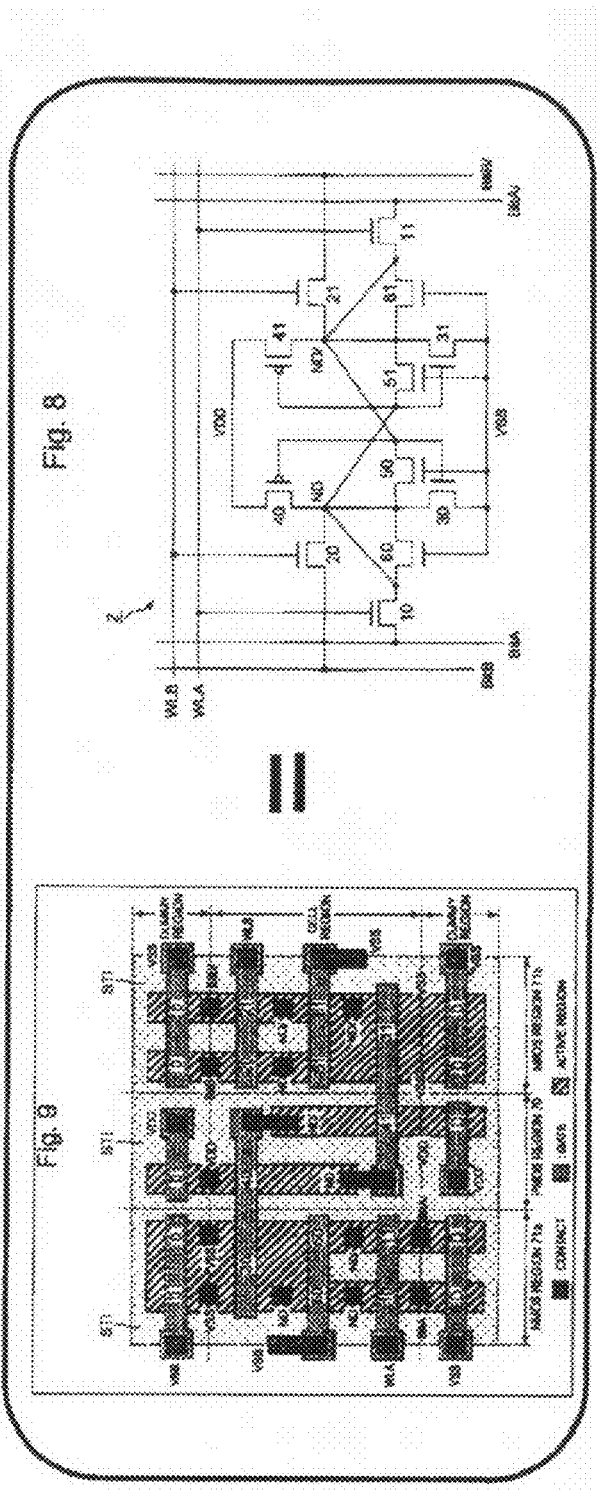

SEMICONDUCTOR DEVICE INCLUDING MEMORY HAVING NODES CONNECTED WITH CONTINUOUS DIFFUSION LAYER BUT ISOLATED FROM EACH OTHER BY TRANSISTOR

BACKGROUND OF THE INVENTION

1. Field of the Invention

The present invention relates to a semiconductor device, and more particularly, relates to a semiconductor device having transmission transistors co-operating in pairs.

2. Description of Related Art

Recent years have seen advances in miniaturization of the fabrication process of a semiconductor device. This miniaturization generates a problem in that even the same-sized transistors provide a variation of drive capability depending on the element shape. If a plurality of transistors co-operating in pairs (hereinafter referred to as pair operation) provide a variation of drive capability, then the pair capability is reduced, thereby causing a problem in that circuit operation may fail. As an example of a transistor performing pair operation, there has been known a dual port static random access memory cell (hereinafter referred to as a dual port SRAM cell). An example of this dual port SRAM cell is disclosed in Patent Document 1.

FIG. 10 shows a circuit diagram of the dual port SRAM cell 100 disclosed in Japanese Patent Laid-Open Application No. 2002-222874. As shown in FIG. 10, the dual port SRAM cell 100 has a first bit line pair (Bit A and Bit A/) connected to a first port and a second bit line pair (Bit B and Bit B/) connected to a second port. On the one hand, data input/output between the first bit line pair and the memory cell storage nodes ND and ND/ is performed via transmission transistors 110 and 111. On the other hand, data input/output between the second bit line pair and the memory cell storage nodes ND and ND/ is performed via transmission transistors 120 and 121.

FIG. 11 shows a schematic view of a plane layout of the dual port SRAM cell 100. As shown in FIG. 11, the dual port SRAM cell 100 has a first region 102, on which load transistors (140 and 141) composed of PMOS transistors are formed; and a second region 101a and a third region 101b, on which drive transistors (130 and 131) and transmission transistors (110, 111, 120, and 121) composed of NMOS transistors are formed. The dual port SRAM cell 100 arranges the second region 101a and the third region 101b by sandwiching the first region 102 therebetween. This arrangement of the second region 101a and the third region 101b allows the first bit line pair and the second bit line pair to be arranged via a power line supplying power to load transistors 140 and 141. The dual port SRAM cell 100 provides this layout to prevent a signal interference generated between the first bit line pair and the second bit line pair.

Here, the dual port SRAM cell 100 provides pair operation of the transmission transistors 110 and 111 connected to the first bit line pair and provides pair operation of the transmission transistors 120 and 121 connected to the second bit line pair. In the dual port SRAM cell 100, the transmission transistors performing pair operation are connected to different storage nodes. For that reason, the transmission transistors performing pair operation must be same in transistor size, but must be isolated with each other. The dual port SRAM cell 100 provides the same gate length and the same gate width of the transmission transistors performing pair operation to equalize the transistor sizes; and provides an element isolation region STI to isolate the two transistors.

Unfortunately, in the dual port SRAM cell 100, the transmission transistor 110 and the transmission transistor 111 are different in shape of diffused region. With reference to FIG. 11, the diffused region at the side of the storage node ND/ of the transmission transistor 111 is integrally formed with the diffused region of the drive transistor 131; and an element isolation region STI (region C in the figure) is formed between the diffused region at the side of the storage node ND of the transmission transistor 110 and the diffused region of the drive transistor 131 and the diffused region of the transmission transistor 111.

In general, in an element isolation region STI (Shallow Trench Insulation), a mechanical stress on silicon changes depending on the STI forming conditions such as an embedding temperature and a film quality. When a compression stress is added to an NMOS transistor in a channel direction, the mobility is lowered. For that reason, in the case of the layout shown in FIG. 11, the transmission transistor 110 receives a large stress from the element isolation region STI (hereinafter referred to as an STI stress) positioned in region C, and the transmission transistor 111 has a small effect of the STI stress from the element isolation region STI. When a transistor receives an STI stress, the STI stress causes a strain of the silicon crystal, and the strain causes a variation of the drive capability. In other words, the layout of the dual port SRAM cell 100 disclosed in the above mentioned Japanese Patent Publication has a problem in that the transmission transistors performing pair operation causes a variation of drive capability due to the STI stress. FIG. 12 shows a graph showing the drive capability for the individual bit line pairs of the dual port SRAM cell 100. As shown in FIG. 12, for the dual port SRAM cell 100, the drive capabilities for the bit line Bit A and the bit line Bit B/ are low (for example, about −5% with respect to the average value) and the drive capabilities for the bit line Bit A/ and the bit line Bit B are high (about +5% with respect to the average value).

SUMMARY OF THE INVENTION

In order to solve the variation of drive capability due to an STI stress, it is considered to align the shape of the transmission transistor 111 with the shape of the transmission transistor 110. FIG. 13 shows a schematic view of a plane layout of the dual port SRAM cell 100 for this case. In the example shown in FIG. 13, the diffused regions at the storage node sides of the transmission transistors 110 and 111 are adjacent to the diffused region of the drive transistor 131 via the element isolation region STI. This layout assures that the transmission transistors 110 and 111 receive a uniform STI stress from region C, thereby allowing the variation of drive capability to be reduced.

However, the drive capability of the MOS transistor depends on an active region length DL formed with contiguous active regions including the source, the drain, and the channel regions of the transistor. In the layout shown in FIG. 13, if the SRAM cell area is designed with the same size as that of FIG. 11, the active region length DL of the transmission transistors 110 and 111 is shorter than the active region length DL of the transmission transistor 111 shown in FIG. 11. In other words, the layout shown in FIG. 13 has a problem in that the drive capability of the transmission transistors 110 and 111 are suppressed, thus impeding the high speed operation of memory. FIG. 14 shows a graph showing the drive capability for the individual bit lines of the dual port SRAM cell 100 using the layout of FIG. 13. As shown in FIG. 14, the dual port SRAM cell 100 for this case provides a uniform drive capability for every bit line. However, the drive capability is limited to a drive capability at the lower side of the dual port SRAM cell 100 shown in FIG. 12.

According to an aspect of the present invention, a semiconductor device includes a memory cell which includes a first inverter and a second inverter. The first inverter includes a first drive transistor and a first load transistor and the second inverter includes a second drive transistor and a second load transistor. An input terminal and an output terminal of the second inverter is respectively connected to an input terminal and an output terminal of the first inverter. The semiconductor device further includes a first transmission transistor provided between the output terminal of the first inverter and one line of a first bit line pair, a second transmission transistor provided between the output terminal of the second inverter and an other line of the first bit line pair, and a first isolation transistor which isolates the first drive transistor and the second transmission transistor. A first active region in which the first transmission transistor, the second transmission transistor, the first drive transistor, and the first isolation transistor are formed is formed in a continuous region; and the first isolation transistor is provided between the first drive transistor and the second transmission transistor.

According to the semiconductor device in accordance with the aspect, the first transmission transistor, the second transmission transistor, and the drive transistor are formed in a continuously formed active region, and the second transmission transistor is isolated from the first transmission transistor and the drive transistor by the isolation transistor. In other words, the second transmission transistor can be isolated without using an element isolation region STI. This allows a uniform STI stress to be applied to the first transmission transistor and the second transmission transistor, thereby reducing the variation of drive capability of the transmission transistors. In addition, it is possible to provide a long active region length by continuously forming the active region and to increase the drive capability of the transmission transistor.

According to the semiconductor device in accordance with the present invention, the drive capability of a transmission transistor can be increased while the variation of drive capability of the transmission transistor is suppressed.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 1 is a circuit diagram of the dual port SRAM cell in accordance with a first exemplary embodiment;

FIG. 2 is an outline drawing of the plane layout of the dual port SRAM cell in accordance with the first exemplary embodiment;

FIG. 7 is a modification of the plane layout of the dual port SRAM cell in accordance with the first exemplary embodiment;

FIG. 8 is a circuit diagram of the dual port SRAM cell in accordance with a second embodiment;

FIG. 9 is an outline drawing of the plane layout of the dual port SRAM cell in accordance with the second exemplary embodiment;

DETAILED DESCRIPTION OF THE EXEMPLARY EMBODIMENTS

First Exemplary Embodiment

Figure 3:
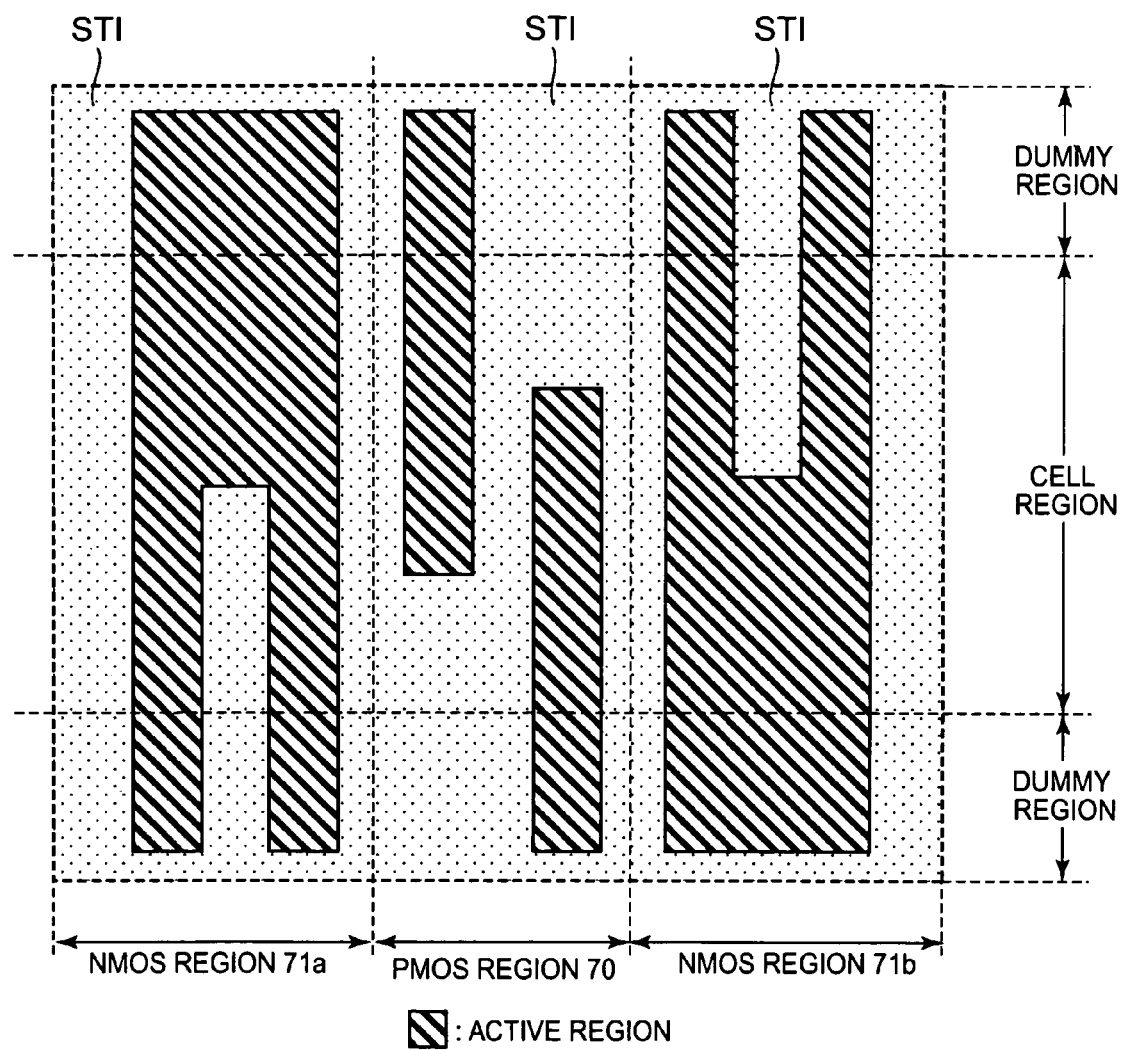
FIG. 3 is an outline drawing of the plane layout of the active region of the dual port SRAM cell in accordance with the first exemplary embodiment.

FIG. 1 shows a circuit diagram of the dual port SRAM cell 1 in accordance with a first exemplary embodiment. In the present embodiment, the dual port SRAM cell will be described as an exemplary embodiment of the semiconductor device of the present invention.

As shown in FIG. 1, the dual port SRAM cell 1 has first to fourth transmission transistors (e.g., transmission transistors 10, 11, 20, and 21), first and second drive transistors (e.g., drive transistors 30 and 31), first and second load transistors (e.g., load transistors 40 and 41), and first and second isolation transistors (e.g., isolation transistors 50 and 51). In addition, the dual port SRAM cell 1 has a first bit line pair consisting of a bit line Bit A and a bit line Bit A/; a second bit line pair consisting of a bit line Bit B and a bit line Bit B/; a first word line WLA; and a second word line WLB.

It should be noted that the present embodiments assume that transmission transistors 10, 11, 20, and 21, drive transistors 30 and 31, and isolation transistors 50 and 51 are formed with NMOS transistors; and load transistors 40 and 41 are formed with PMOS transistors.

The load transistor 40 and the drive transistor 30 are serially connected between the power node VDD and the ground node VSS which constitute the first inverter. The load transistor 41 and the drive transistor 31 are serially connected between the power node VDD and the ground node VSS which constitute the second inverter. In addition, the drain of the load transistor 40 and the drain of the drive transistor 30 are connected to each other, the connection point of which is a first storage node ND; and the drain of the load transistor 41 and the drain of the drive transistor 31 are connected to each other, the connection point of which is a second storage node ND/.

Any one of the source and the drain of the isolation transistor 50 is connected to the first storage node ND and the other thereof is connected to the input of the first inverter. In addition, the gate of the isolation transistor 50 is connected to the ground node VSS. Any one of the source and the drain of the isolation transistor 51 is connected to the second storage node ND/ and the other thereof is connected to the input of the second inverter. In addition, the gate of the isolation transistor 51 is connected to the ground node VSS. In other words, an off voltage (ground potential for an NMOS transistor) is always applied to the gates of the isolation transistors 50 and 51, and the isolation transistors 50 and 51 maintain a non-conducting state.

The transmission transistor 10 is connected between the bit line Bit A and the first storage node ND. In addition, the gate of the transmission transistor 10 is connected to the first word line WLA. The transmission transistor 11 is connected between the bit line Bit A/ and the second storage node ND. In addition, the gate of the transmission transistor 11 is connected to the first word line WLA. The transmission transistors 10 and 11 perform pair operation according to the voltage level of the first word line WLA. Hereinafter, as needed, a pair of transmission transistors 10 and 11 is referred to as a first transmission transistor pair.

The transmission transistor 20 is connected between the bit line Bit B and the first storage node ND. In addition, the gate of the transmission transistor 20 is connected to the second word line WLB. The transmission transistor 21 is connected between the bit line Bit B/ and the second storage node ND. In addition, the gate of the transmission transistor 21 is connected to the second word line WLB. The transmission transistors 20 and 21 perform pair operation according to the voltage level of the second word line WLB. Hereinafter, as needed, a pair of transmission transistors 20 and 21 is referred to as a second transmission transistor pair.

The dual port SRAM cell 1 performs data input/output between the first bit line pair and the first storage node ND and the second storage node ND/ via the first transmission transistor pair. In addition, the dual port SRAM cell 1 performs data input/output between the second bit line pair and the first storage node ND and the second storage node ND/ via the second transmission transistor pair. For that reason, in order to align the reaction rate of data input/output performed between a bit line and a storage node to be equal between the two bit lines, a relative variation of drive capability of the two drive transistors constituting a transmission transistor pair is required to be reduced.

Here, FIG. 1 shows an example of the plane layout of the dual port SRAM cell 1 in accordance with a first embodiment. The example shown in FIG. 2 shows a plane layout for arranging one memory cell. As shown in FIG. 2, the dual port SRAM cell 1 has a cell region, dummy regions, a first region (e.g., PMOS region) 70, a second region (e.g., NMOS region) 71a, and the third region (e.g., NMOS region) 71b.

Transistors serving as a circuit of the memory cell are arranged in the cell region. The dummy regions are arranged so as to sandwich the cell region. In the example of FIG. 2, an individual dummy region is arranged in the upper side and in the lower side of the cell region. Transistors D without serving as a circuit are formed in the dummy regions. The dummy transistors D are arranged to prevent the gates of the transistors serving as a circuit of the memory cell from varying in the fabrication process.

In addition, in the example shown in FIG. 2, the NMOS regions 71a and 71b in which the NMOS transistors are formed are arranged so as to sandwich the PMOS region 70 in which the PMOS transistors are formed. According to the present embodiment, the load transistors 40 and 41 are formed in the PMOS region 70. An active region including the source, the drain, and the channel regions of the load transistors is formed in the PMOS region 70. Of the active region formed in the PMOS region 70, the diffused region in which the source and the drain of the transistor are formed is formed with a first conductivity type (e.g., p-type) semiconductor. Of the active region formed in the PMOS region 70, the diffused region in which the channel region of a transistor is formed is formed with a second conductivity type (e.g., n-type) semiconductor.

The drive transistor 31, the transmission transistors 10 and 11, and the isolation transistor 50 are formed in the NMOS region 71a. The active region including the source, the drain, and the channel regions of the drive transistor 31, the transmission transistors 10 and 11, and the isolation transistor 50 is formed in the NMOS region 71a. Of the active region formed in the NMOS region 71a, the diffused region in which the source and the drain of the transistor are formed is formed with a p-type semiconductor. Of the active region formed in the NMOS region 71a, the diffused region in which the channel region of the transistor is formed is formed with an n-type semiconductor.

The drive transistor 30, the transmission transistors 20 and 21, and the isolation transistor 51 are formed in the NMOS region 71b. The active region including the source, the drain, and the channel regions of the drive transistor 30, the transmission transistors 20 and 21, and the isolation transistor 51 is formed in the NMOS region 71b. Of the active region formed in the NMOS region 71b, the diffused region in which the source and the drain of the transistor are formed is formed with an n-type semiconductor. Of the active region formed in the NMOS region 71b, the diffused region in which the channel region of the transistor is formed is formed with a p-type semiconductor.

Here, FIG. 3 shows the plane layout showing only the active region in the layout of the dual port SRAM cell 1. As shown in FIG. 3, in the top view of the dual port SRAM cell 1, the individual active region is surrounded by an element isolation region STI. Two active regions are separately formed in the PMOS region 70: one corresponding to the load transistor 40 and one corresponding to the load transistor 41. Each of the NMOS regions 71a and 71b has an active region in which a plurality of transistors are formed and the active region thereof is integrally formed with a continuous region without separation. It should be noted that the active region of the individual region includes an active region corresponding to a transistor in the cell region and an active region corresponding to a transistor in the dummy regions, which are integrally formed with a continuous region.

Hereinafter, the arrangement of transistors in accordance with the present embodiment will be described with reference to the layout shown in FIG. 2. According to the present embodiment, the channel region of a transistor is formed in the active region positioned at the bottom side of the gate of the transistor. In addition, in FIG. 2, the same reference symbols as assigned to the transistor shown in FIG. 1 are assigned to the gate of a transistor corresponding to the transistor shown in FIG. 1. The reference symbols assigned to the contacts in FIG. 2 are the same reference symbols as those corresponding to the node or the line in the circuit diagram of FIG. 1. In addition, the individual transistors are connected to the line (not shown) formed in the upper layer via the contact.

The load transistors 40 and 41 are formed in the PMOS region 70. The load transistor 40 and the load transistor 41 are formed each in a different active region. Of the active region of the load transistor 40, a contact connected to the power node VDD is formed in the diffused region at the source side thereof. In addition, the active region of the load transistor 40 is integrally formed with the active region of the dummy transistor D formed at the lower side in the figure. The gate of the load transistor 40 is integrally formed with the gate of the drive transistor 30 formed in NMOS region 71a. The gate of the load transistor 40 is connected to the second storage node ND/ via the contact. The diffused region at the drain side of the load transistor 40 is connected to the first storage node ND via the contact.

Of the active region of the load transistor 41, a contact connected to the power node VDD is formed in the diffused region at the source side thereof. In addition, the active region of the load transistor 41 is integrally formed with the active region of the dummy transistor D formed in a dummy region at the upper side in the figure. The gate of the load transistor 41 is integrally formed with the gate of the drive transistor 31 formed in NMOS region 71*b*. The gate of the load transistor 41 is connected to the first storage node ND via the contact. The diffused region at the drain side of the load transistor 41 is connected to the second storage node ND/ via the contact.

The drive transistor 31, the transmission transistors 10 and 11, and the isolation transistor 50 are formed in the NMOS region 71*a*. The transistors arranged in the NMOS region 71*a* are formed in the first active region having a continuous region. The transmission transistors 10 and 11 are arranged such that the sides of the active regions thereof in a direction from the source to the drain face each other via the element isolation region STI. In other words, the transmission transistors 10 and 11 are arranged in a position to be connected in parallel with each other. The gates of the transmission transistors 10 and 11 are integrally formed and are connected to the first word line WLA via the contact. A contact connected to the bit line Bit A is formed in the diffused region at the side of bit line Bit A of the transmission transistor 10. In addition, the diffused region at the side of bit line Bit A of the transmission transistor 10 is integrally formed with the diffused region of the dummy transistor D formed in the dummy region at the lower side of the figure. A contact connected to the bit line Bit A/ is formed in the diffused region at the side of bit line Bit A/ of the transmission transistor 11. In addition, the diffused region at the side of bit line Bit A/ of the transmission transistor 11 is integrally formed with the diffused region of the dummy transistor D formed in the dummy region at the lower side of the figure.

A contact connected to the first storage node ND is formed in the diffused region at the side of the first storage node ND of the transmission transistor 10. The diffused region at the side of the first storage node ND of the transmission transistor 10 is formed so as to be adjacent to the diffused region at the side of the second storage node ND/ of the transmission transistor 11 and the diffused region at the drain side of the drive transistor 31 via the channel region formed at the lower side of the gate of the isolation transistor 50. It should be noted that the diffused region at the side of the first storage node ND of the transmission transistor 10 is integrally formed with an active region in which the diffused region at the side of the second storage node ND/ of the transmission transistor 11 and the diffused region at the drain side of the drive transistor. In other words, the transmission transistor 10 is arranged in a position to be serially connected to the drive transistor 31 via the isolation transistor 50.

A contact connected to the second storage node ND/is formed in the diffused region at the side of the second storage node ND/ of the transmission transistor 11. The diffused region at the side of the second storage node ND/ of the transmission transistor 11 is integrally formed with the diffused region at the drain side of the drive transistor 31. In other words, the transmission transistor 11 is arranged in a position to be serially connected to the drive transistor 31.

A contact connected to the ground node VSS is formed in the diffused region at the source side of the drive transistor 31. In addition, the diffused region at the source side of the drive transistor 30 is integrally formed with the diffused region of the dummy transistor D formed in the dummy region at the upper side of the figure.

The gate of the isolation transistor 50 is formed between the transmission transistor 10 and the drive transistor 31. In addition, the gate of the isolation transistor is formed in a position where the channel region formed in a lower side of the gate isolates the diffused region at the side of the first storage node ND of the transmission transistor 10 from the diffused region at the side of the second storage node ND/ of the transmission transistor 11 and isolates the diffused region at the side of the first storage node ND of the transmission transistor 10 from the diffused region at the drain side of the drive transistor 31. In addition, the gate of the isolation transistor 50 is connected to the ground node VSS via a contact. In other words, the isolation transistor 50 maintains a non-conducting state. The diffused region adjacent to the gate of the isolation transistor 50 serves as the source and the drain of the isolation transistor 50.

The NMOS region 71*b* is arranged such that the NMOS region 71*a* is reversed from top to bottom and left to right (e.g., symmetric with respect to the center point of the layout of the memory cell) and thus is substantially identical to the NMOS region 71*a*. Such a reversed relation between the transistor arrangement for the NMOS region 71*b* and the transistor arrangement for the NMOS region 71*a* can increase the efficiency of layout for continuously forming the cell region. It should be noted that, of the NMOS region 71*b*, an active region in which the load transistor 31, transmission transistors 10 and 11, and the isolation transistor 50 are formed is referred to as a second active region.

Figure 4:
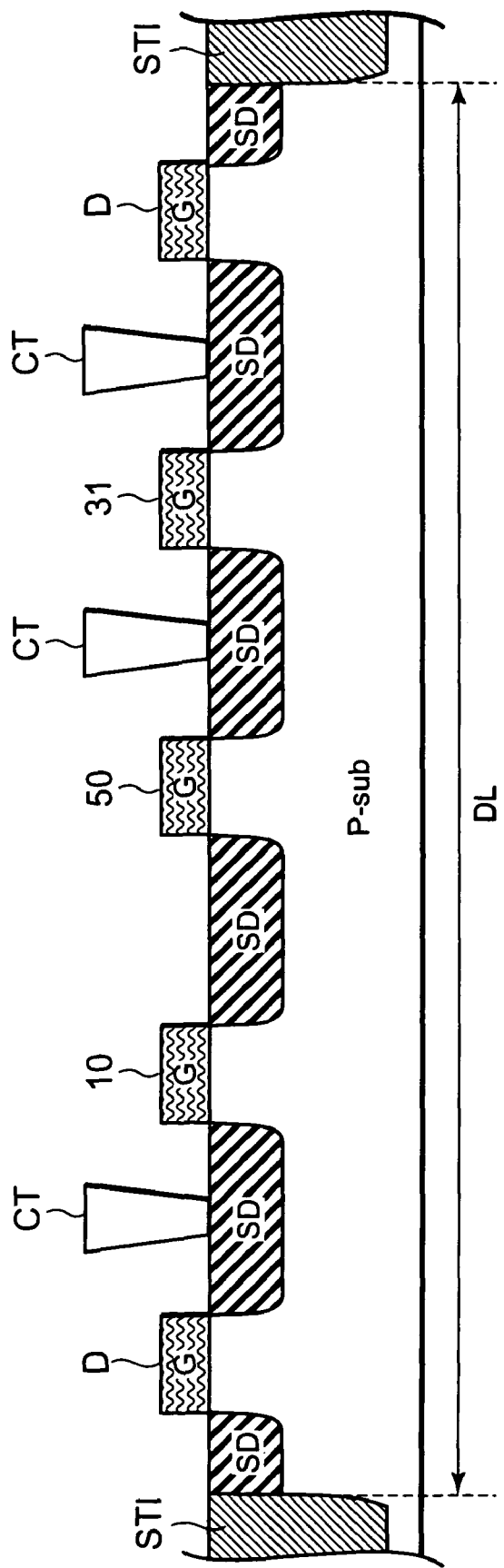
FIG. 4 is a cross-sectional view of the dual port SRAM cell along X-X in the plane layout shown in FIG. 2.
Figure 5:
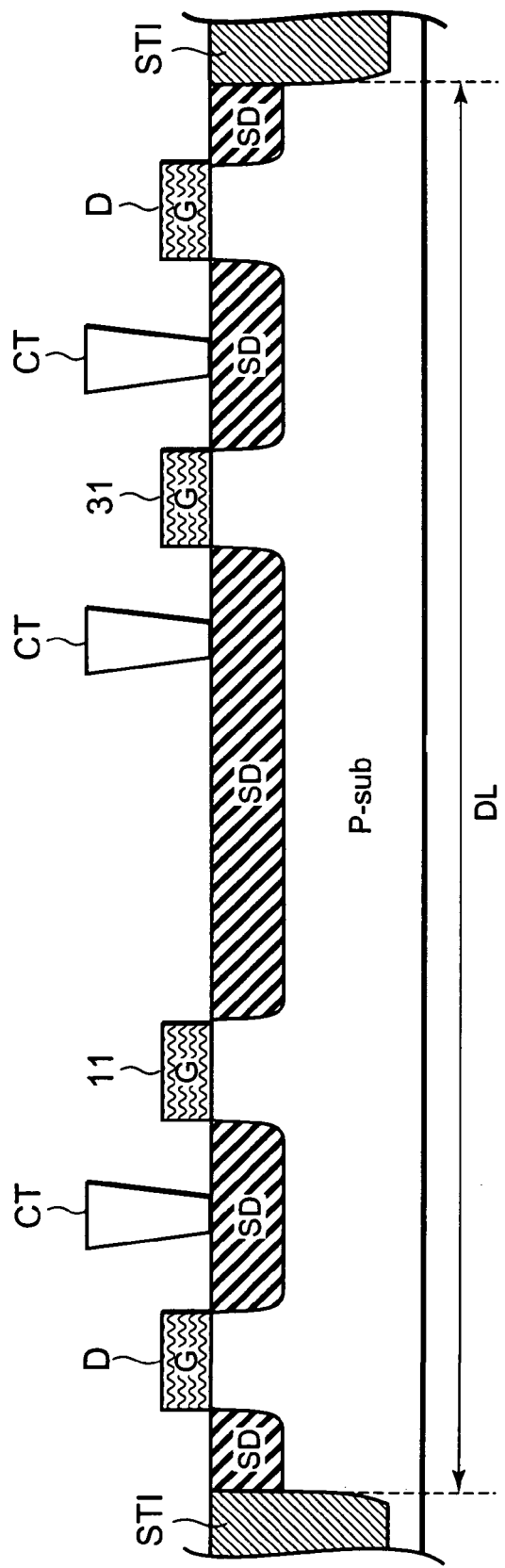
FIG. 5 is a cross-sectional view of the dual port SRAM cell along Y-Y in the plane layout shown in FIG. 2.

Here, the cross section of the semiconductor device along the line X-X shown in FIG. 2 is shown in FIG. 4; and the cross section of the semiconductor device along the line Y-Y shown in FIG. 2 is shown in FIG. 5. As shown in FIG. 4 and FIG. 5, the NMOS region 71*a* in accordance with the present embodiment provides a continuous active region without inserting an element isolation region STI therebetween, and transistors are formed in the cell region thereof. For that reason, the active region length DL of the active region in both the cross sections shown in FIG. 4 and FIG. 5 is a distance from the element isolation region STI in contact with the end of the dummy transistor D arranged at the lower side of the FIG. 2 to the element isolation region STI in contact with the end of the dummy transistor arranged at the upper side. It should be noted that, in FIG. 4 and FIG. 5, SD indicates a diffused region; P-sub indicates a substrate region; G indicates the gate of a transistor; and CT indicates a contact.

As described above, the dual port SRAM cell 1 in accordance with the present embodiment uses an isolation transistor to isolate a drive transistor and a transmission transistor. This enables the drive transistor and the transmission transistor to be isolated without using an element isolation region STI. Therefore, like the dual port SRAM cell 1, even if a transmission transistor connected to a drive transistor and a transmission transistor not connected to a drive transistor are formed in the same NMOS region, the effect of the STI stress can be uniform for all the transmission transistors. Accordingly, the dual port SRAM cell 1 in accordance with the present embodiment can prevent the variation of drive capability of transmission transistors performing pair operation from occurring due to an STI stress.

In addition, the dual port SRAM cell 1 in accordance with the present embodiment forms mutually isolated transistors in a continuously formed active region without using an element isolation region STI. By this, even the transistor isolated from other transistor can have a long active region length DL and can increase the drive capability of the transistor. According to the above embodiment, of the transistors performing pair operation, the active region length DL of the transmission transistor isolated from other transistor can be set to be longer than the conventional length to increase the drive capability of the transmission transistor isolated from other transistor. In addition, the increased drive capability of the transmission transistor can increase the operation speed of the dual port SRAM cell 1.

Figure 6:
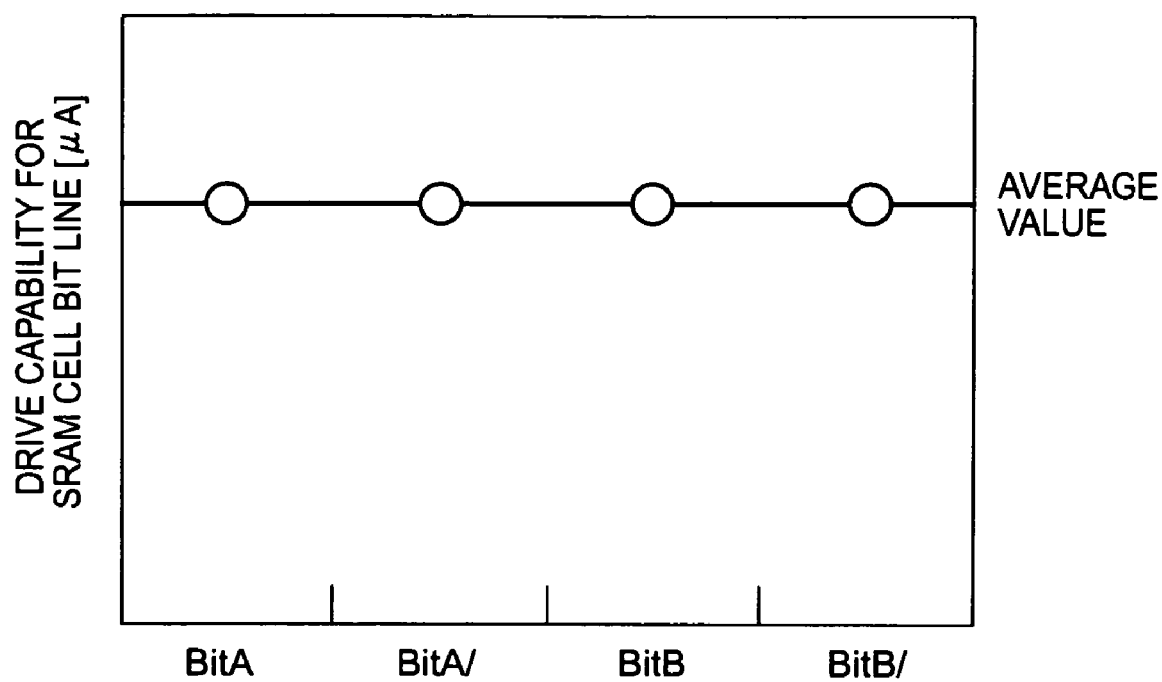
FIG. 6 is a graph showing the drive capability for the individual bit lines of the dual port SRAM cell in accordance with the first exemplary embodiment.
Figure 10:
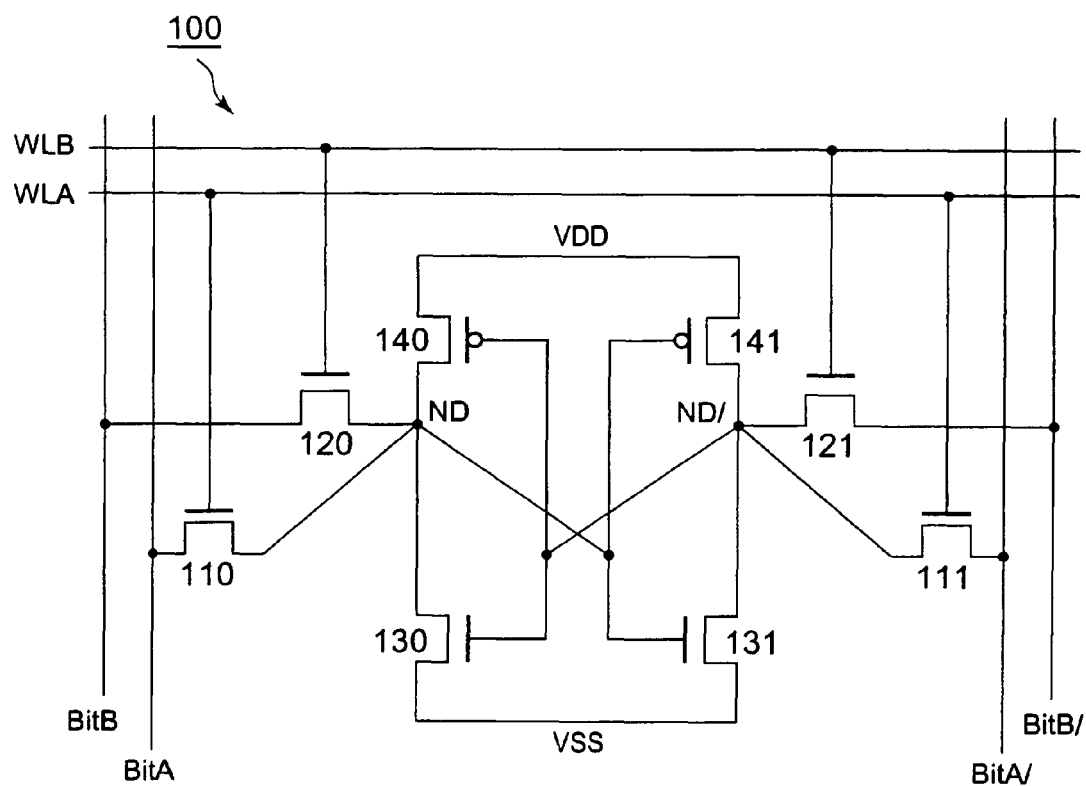
FIG. 10 is a circuit diagram of the dual port SRAM cell in accordance with a related art.
Figure 12:
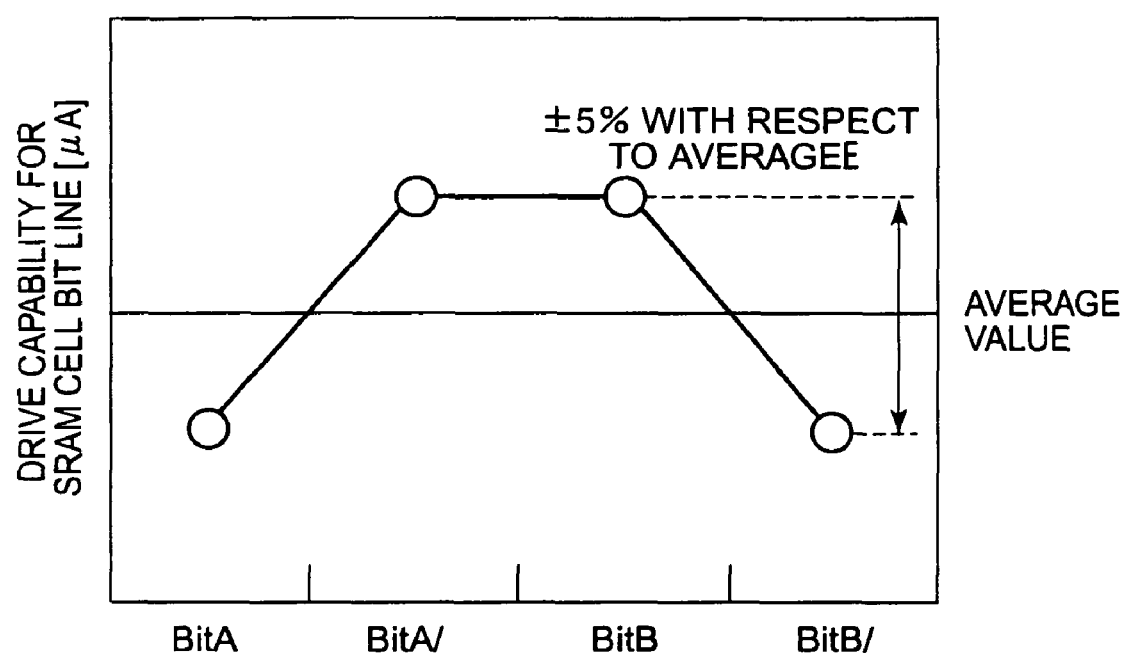
FIG. 12 is a graph showing the drive capability for the individual bit lines of the dual port SRAM cell in accordance with the related art.
Figure 13:
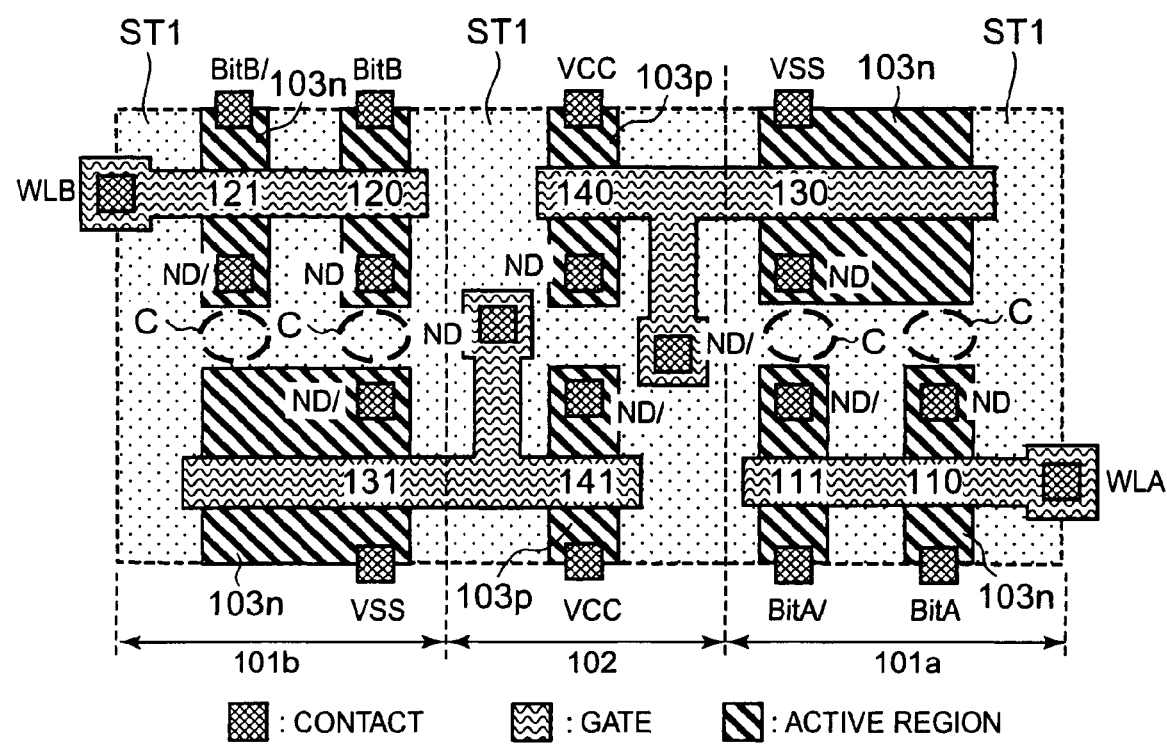
FIG. 13 is a modification of the plane layout of the dual port SRAM cell in accordance with the related art.
Figure 14:
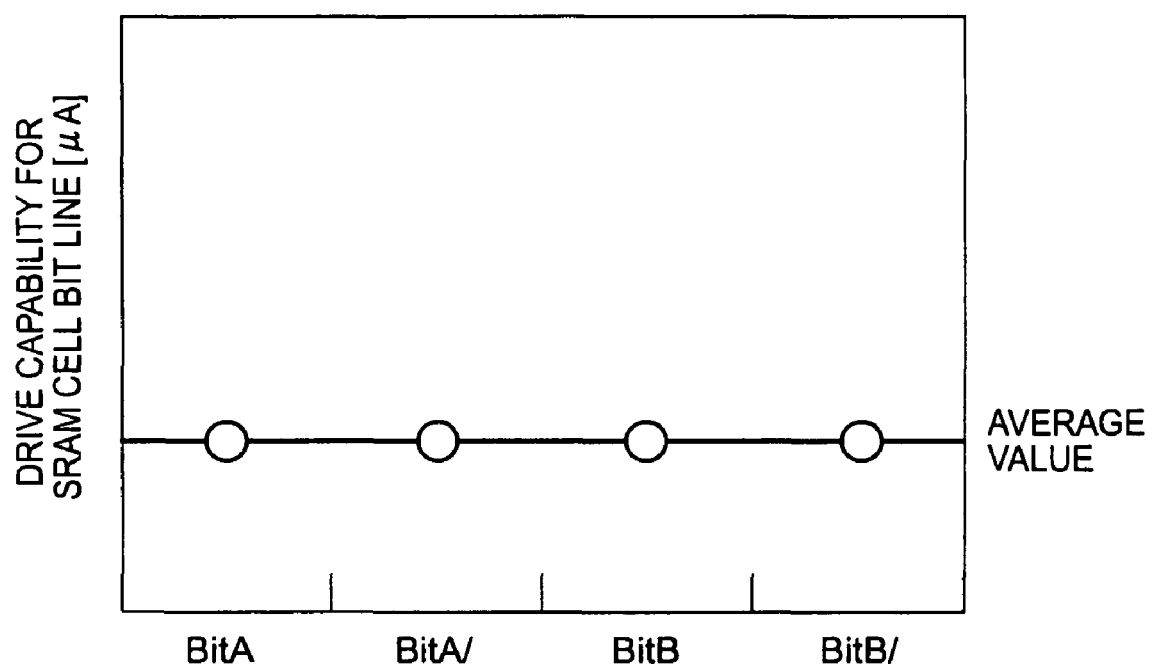
FIG. 14 is a graph showing the drive capability for the individual bit lines of the dual port SRAM cell using the layout shown in FIG. 13.

Further, conventionally, in the case where the transistors requiring pair operation have different drive capability due to the difference in active region length DL, the active region length of the transistors are limited to the shortest active region length in order to suppress the variation of drive capability. On the contrary, the present embodiment can maintain isolation between transistors without using an element isolation region STI and thus can adjust the active region length of the transistors to the longest active region length thereof while maintaining isolation between transistors. In short, the present embodiment can suppress the variation of drive capability of the transmission transistors performing pair operation and can increase the drive capability thereof. FIG. 6 shows a graph showing the drive capability of the dual port SRAM cell 1 for the individual bit lines. As shown in FIG. 6, the dual port SRAM cell 1 has a uniform drive capability for all the bit lines. In addition, the drive capability is higher than that of the conventional dual port SRAM cell 100 shown in FIG. 12.

Figure 11:
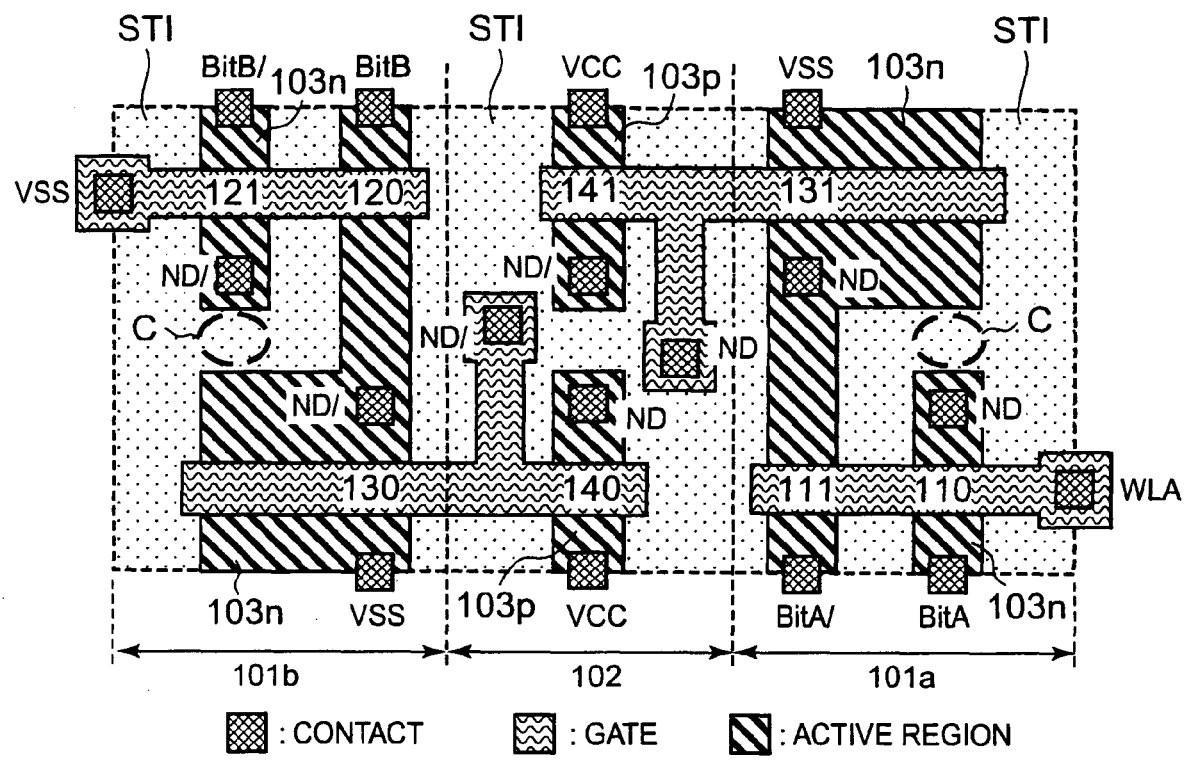
FIG. 11 is an outline drawing of the plane layout of the dual port SRAM cell in accordance with the related art.

FIG. 7 shows a modification of the plane layout shown in FIG. 2. With reference to the plane shown in FIG. 7, the transistor arrangement of the PMOS region 70 is placed in the same way as that of first region 102 of the plane layout shown in FIG. 11. Even in this case, the transmission transistor 10 is isolated from the drive transistor 30 and transmission transistor 11 by the isolation transistor 50. In other words, the effect of the dual port SRAM cell in accordance with the present embodiment does not depend on the shape of a transistor in the PMOS region 70.

Second Exemplary Embodiment

FIG. 8 shows a circuit diagram of the dual port SRAM cell 2 in accordance with a second exemplary embodiment. As shown in FIG. 8, the dual port SRAM cell 2 in accordance with a second exemplary embodiment adds a third isolation transistor (e.g., isolation transistors 60 and 61) to the dual port SRAM cell 1 in accordance with the first exemplary embodiment. According to present embodiment, the isolation transistors 60 and 61 are formed with an NMOS transistor.

The isolation transistor 60 is connected between the first storage node ND and the transmission transistor 10. In addition, the gate of the isolation transistor 60 is connected to the ground node VSS. The isolation transistor 61 is connected between the second storage node ND/ and the transmission transistor 11. In addition, the gate of the isolation transistor 61 is connected to the ground node VSS. In other words, an off voltage (ground voltage for an NMOS transistor) is always applied to gates of the isolation transistors 50 and 51, and the isolation transistors 50 and 51 maintain a non-conducting state.

Here, FIG. 9 shows an outline drawing of the plane layout of the dual port SRAM cell 2. As shown in FIG. 9, the dual port SRAM cell 2 changes the individual position of the drive transistors 30 and 31; changes the individual position of the load transistors 40 and 41; and adds the isolation transistors 60 and 61 with respect to the plane layout of the dual port SRAM cell 1 shown in FIG. 2.

The isolation transistor 60 is formed using a gate common to the gate of the isolation transistor 50. The gate constituting the isolation transistors 50 and 60 is formed in a position where the channel region formed at the lower side of the gate isolates the diffused region of the drive transistor 30 and the diffused region of the transmission transistor 10, and isolates the diffused region of the drive transistor 30 and the diffused region of the transmission transistor 11. A transistor formed between the drive transistor 30 and the transmission transistor 10 serves as the isolation transistor 60, and a transistor formed between the drive transistor 30 and the transmission transistor 11 serves as the isolation transistor 50. In other words, the drive transistor 30, the transmission transistor 10, and the transmission transistor 11 are isolated from each other by the isolation transistors 50 and 60. It should be noted that the ground potential is supplied from the ground node VSS to the gate constituting the isolation transistors 50 and 60 via a contact. In addition, the drive transistor 30 and transmission transistor 10 are connected to the first storage node ND via a contact.

The isolation transistor 61 is formed using a gate common to the gate of the isolation transistor 51. The gate constituting the isolation transistors 51 and 61 is formed in a position where the channel region formed at the lower side of the gate isolates the diffused region of the drive transistor 31 and the diffused region of the transmission transistor 20, and isolates the diffused region of the drive transistor 31 and the diffused region of the transmission transistor 21. A transistor formed between the drive transistor 31 and the transmission transistor 20 serves as the isolation transistor 51, and a transistor formed between the drive transistor 31 and the transmission transistor 21 serves as the isolation transistor 61. It should be noted that the ground potential is supplied from the ground node VSS to the gate constituting the isolation transistors 51 and 61 via a contact. In addition, the drive transistor 31 and transmission transistor 21 are connected to the second storage node ND/ via a contact.

As described above, the dual port SRAM cell 2 in accordance with the second exemplary embodiment uses an isolation transistor to isolate the transmission transistors performing pair operation from a drive transistor. In other words, the transmission transistors can be isolated without using an element isolation region STI. Therefore, in the same way as in the first exemplary embodiment, it is possible to suppress the variation of drive capability of transmission transistors due to an STI stress, suppress the variation of drive capability of transmission transistors due to the difference in active region length DL and increase the drive capability of a transmission transistor.

Further, according to the second exemplary embodiment, the effect of the isolation transistor appears uniformly to the transmission transistors performing pair operation. In other words, the dual port SRAM cell 2 in accordance with the second exemplary embodiment can use the effect of the isolation transistor to suppress the relative variation between the transmission transistors. Accordingly, the dual port SRAM cell 2 in accordance with the second exemplary embodiment is more effective in suppressing the relative variation of the transmission transistors performing pair operation and can operates at a higher speed than the dual port SRAM cell 1 in accordance with the first embodiment.

It should be noted that the present invention is not limited to the above embodiments, and various modifications can be made to the present invention without departing from the spirit and scope of the invention. For example, when cells are adjacently formed, an isolation transistor is provided between the adjacently formed drive transistors, and thereby isolation can be provided between the drive transistors. In addition, in the above embodiments, the layout is described such that one cell region is sandwiched by dummy regions, but it is possible to provide a layout where a plurality of cell regions are adjacently arranged and the plurality of cell regions are sandwiched by dummy regions.

Further, it is noted that Applicant's intent is to encompass equivalents of all claim elements, even if amended later during prosecution.

What is claimed is:

1. A semiconductor device, comprising:
   a memory cell which includes a first inverter and a second inverter, said first inverter comprising a first drive transistor and a first load transistor, said second inverter including a second drive transistor and a second load transistor, and an input terminal and an output terminal thereof, respectively, connected to an input terminal and an output terminal of the first inverter;
   a first transmission transistor provided between the output terminal of the first inverter and a line of a first bit line pair;
   a second transmission transistor provided between the output terminal of the second inverter and an other line of the first bit line pair;
   a third transmission transistor provided between the output terminal of the first inverter and a line of a second bit line pair;
   a fourth transmission transistor provided between the output terminal of the second inverter and an other line of the second bit line pair;
   a first isolation transistor which isolates the second drive transistor and the second transmission transistor; and
   a second isolation transistor having a gate formed commonly to a gate of the first isolation transistor, the second isolation transistor isolating the first transmission transistor and the second drive transistor,
   wherein a first active region in which the first transmission transistor, the second transmission transistor, the second drive transistor, and the first isolation transistor are formed, is formed in a continuous region, and
   wherein the first isolation transistor is provided between the second drive transistor and the second transmission transistor.

2. The semiconductor device according to claim 1, further comprising:
   a second isolation transistor which isolates the second drive transistor and the first transmission transistor,
   wherein the first active region in which the first transmission transistor, the second transmission transistor, the second drive transistor, the first isolation transistor, and the second isolation transistor are formed, is formed in a continuous region, and
   wherein the second isolation transistor is provided between the second drive transistor and the first transmission transistor.

3. A semiconductor device, comprising:
   a memory cell which includes a first inverter and a second inverter, said first inverter comprising a first drive transistor and a first load transistor, said second inverter including a second drive transistor and a second load transistor, and an input terminal and an output terminal thereof, respectively, connected to an input terminal and an output terminal of the first inverter;
   a first transmission transistor provided between the output terminal of the first inverter and a line of a first bit line pair;
   a second transmission transistor provided between the output terminal of the second inverter and another line of the first bit line pair;
   a first isolation transistor which isolates the second drive transistor and the second transmission transistor;
   a second isolation transistor having a gate formed commonly to a gate of the first isolation transistor, and the second isolation transistor isolates the first transmission transistor and the second drive transistor,
   wherein a first active region in which the first transmission transistor, the second transmission transistor, the second drive transistor, and the first isolation transistor are formed, is formed in a continuous region,
   wherein the first isolation transistor is provided between the second drive transistor and the second transmission transistor.

* * * * *